United States Patent

Chen et al.

(10) Patent No.: US 12,340,717 B2
(45) Date of Patent: Jun. 24, 2025

(54) DISPLAY DEVICE ROTATABLE AROUND A ROTATION AXIS FOR DISPLAY

(71) Applicant: WUHAN CHINA STAR OPTOELECTRONICS TECHNOLOGY CO., LTD., Hubei (CN)

(72) Inventors: Yunni Chen, Hubei (CN); Fancheng Liu, Hubei (CN); Guowei Zha, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 18/043,423

(22) PCT Filed: Feb. 7, 2023

(86) PCT No.: PCT/CN2023/074790
§ 371 (c)(1),
(2) Date: Feb. 28, 2023

(87) PCT Pub. No.: WO2024/082487
PCT Pub. Date: Apr. 25, 2024

(65) Prior Publication Data
US 2025/0037627 A1    Jan. 30, 2025

(30) Foreign Application Priority Data

Oct. 18, 2022   (CN) .......................... 202211274651.0

(51) Int. Cl.
*G09G 3/32*   (2016.01)
*G09G 3/00*   (2006.01)
*H10K 59/121*   (2023.01)

(52) U.S. Cl.
CPC ............... *G09G 3/005* (2013.01); *G09G 3/32* (2013.01); *H10K 59/1213* (2023.02); *G09G 2300/0439* (2013.01); *G09G 2320/0233* (2013.01)

(58) Field of Classification Search
CPC .. G09G 3/005; G09G 3/32; G09G 2300/0439; G09G 2320/0233; H10K 59/1213
See application file for complete search history.

(56) References Cited

U.S. PATENT DOCUMENTS

2017/0103926 A1\* 4/2017 Aoyagi .................... H01L 22/22
2021/0193067 A1\* 6/2021 Shao ..................... G09G 3/3685
2022/0139344 A1\* 5/2022 Shao ....................... G09G 3/005
345/204

FOREIGN PATENT DOCUMENTS

CM    109493774 A    3/2019
CN    110579885 A    12/2019
(Continued)

OTHER PUBLICATIONS

International Search Report in International application No. PCT/CN2023/074790, mailed on Apr. 18, 2023.
(Continued)

*Primary Examiner* — Pegeman Karimi
(74) *Attorney, Agent, or Firm* — PV IP PC; Wei Te Chung (57) ABSTRACT

A display device is provided. The display device includes a display panel that can be rotated and displayed around a rotation axis. The display panel comprises a plurality of first light-emitting element groups disposed in a first direction. The first direction is from the rotation axis to the edge of the display panel away from the rotation axis. A distribution density of the first light-emitting element in the first light-emitting element group close to the rotation axis is less than
(Continued)

a distribution density of the first light-emitting element in the first light-emitting element group far from the rotation axis.

18 Claims, 9 Drawing Sheets

(56) References Cited

FOREIGN PATENT DOCUMENTS

| | | |
|---|---|---|
| CN | 110996093 A | 4/2020 |
| CN | 112213867 A | 1/2021 |
| CN | 112634799 A | 4/2021 |
| CN | 115662338 A | 1/2023 |
| CN | 115685586 A | 2/2023 |
| WO | 2021046757 A1 | 3/2021 |

OTHER PUBLICATIONS

Written Opinion of the International Search Authority in International application No. PCT/CN2023/074790 , mailed on Apr. 18, 2023.

* cited by examiner

DISPLAY DEVICE ROTATABLE AROUND A ROTATION AXIS FOR DISPLAY

CROSS REFERENCE TO RELATED APPLICATIONS

This application claims the priority of a Chinese patent application No. 202211274651.0, filed on Oct. 18, 2022, with the Chinese Patent Office, entitled "Display Device", the contents of which are incorporated herein by reference in their entirety.

FIELD OF INVENTION

This disclosure relates to a field of display technology, and more particularly, to a display device.

BACKGROUND OF INVENTION

At present, there are many types of rotary display devices. The most common commercially available product is the "3D" fan screen. The "3D" fan screen uses LED lamp beads as light-emitting elements, which has the problem of low resolution and uneven display. Another type of the rotary display device is a scanning 3D display device, which uses one side of the display device as an axis to perform rotary scanning to form a cylindrical display space. This makes the display device displays higher brightness at a position close to s rotating axis, and the overall brightness of the display panel is unevenly displayed, which affects the actual display effect.

At present, the main methods to solve the above problems are to change the physical structure of the rotary display device or to adjust the pixel lighting process through algorithms. These methods are not universal and greatly increase the complexity of the display method.

Technical Problem

The embodiment of the disclosure provides a display device to solve the technical problem that the overall brightness display of the display panel of the rotary display device is uneven, which affects the actual display effect.

SUMMARY OF INVENTION

Technical Solutions

In order to solve the above-mentioned problems, the technical solutions provided by this disclosure are as follows.

The disclosure provides a display device. The display device comprises:

at least one display panel, wherein the display panel is rotated around a rotation axis for display, and wherein the display panel comprises a plurality of first light-emitting element groups disposed in a first direction, the first light-emitting element group comprises a plurality of first light-emitting elements, the first direction is perpendicular to the rotation axis, and the first direction is directed from the rotation axis to a side of the display panel away from the rotation axis.

Besides, a distribution density of each of the first light-emitting elements in the first light-emitting element group close to the rotation axis is less than the distribution density of each of the other first light-emitting elements in the first light-emitting element group far from the rotation axis.

In one embodiment, the first light-emitting element group comprises a plurality of first subgroups disposed along the first direction, each of the first subgroups comprises a plurality of first light-emitting elements disposed along a second direction, and the second direction is parallel to the rotation axis, and the distribution density of the first light-emitting elements in the plurality of first subgroups in at least one of the first light-emitting element groups is the same.

In one embodiment, the plurality of first light-emitting elements disposed in same first subgroup is evenly spaced along the second direction.

In one embodiment, in any two adjacent first subgroups, the first light-emitting elements in one first subgroup and the first light-emitting elements in the other first subgroup are interlaced among each other along the second direction.

In one embodiment, one of the first light-emitting element groups comprises at least two first subgroups disposed along the first direction, and in any two of the first light-emitting element groups, a distance between each of the first subgroups in one of the first light-emitting element groups is equal to a distance between each of the first subgroups in the other first light-emitting element group.

In one embodiment, the display panel comprises a first display portion and a second display portion respectively disposed on opposite sides of the rotation axis, the plurality of the first light-emitting element groups is arranged in the first display portion, the second display portion comprises a plurality of second light-emitting element groups arranged along the first direction, the second light-emitting element group comprises a plurality of second light-emitting elements. In the first light-emitting element group and the second light-emitting element group with same length from the rotation axis, rotation paths of the plurality of first light-emitting elements of the first light-emitting element group and the plurality of second light-emitting elements of the second light-emitting element group do not overlap.

In one embodiment, a distance from one side of the first display portion away from the rotation axis to the rotation axis is equal to a distance from one side of the second display portion away from the rotation axis to the rotation axis.

In one embodiment, a change rate of the distribution density of the first light-emitting element of the first display portion and a change rate of a distribution density of the second light-emitting element of the second display portion are symmetrical with respect to the rotation axis.

In one embodiment, a shape of the first display portion and a shape of the second display portion are symmetrical with respect to the rotational axis.

In one embodiment, the display panel comprises a plurality of driving thin film transistors, and one of the driving thin film transistors is connected to one of the first light-emitting elements. When the first light-emitting element emits light, a current in the driving thin film transistor connected to the first light-emitting element close to the rotation axis is less than a current in the driving thin film transistor connected to the first light-emitting element far from the rotation axis.

In one embodiment, in the first direction, a width to length ratio of a channel portion of the driving thin film transistor connected to the first light-emitting element close to the rotation axis is less than a width to length ratio of a channel portion of the driving thin film transistor connected to the first light-emitting element away from the rotation axis.

In one embodiment, the driving thin film transistor at least comprises a gate electrode, a source electrode, a drain electrode, and an active layer, and the active layer comprises the channel portion arranged between the source electrode and the drain electrode.

In one embodiment, the driving thin film transistor is a low-temperature polysilicon thin film transistor, an oxide semiconductor thin film transistor or an amorphous silicon thin film transistor.

In one embodiment, the display panel comprises a control circuit, the control circuit controls at least one of the first light-emitting elements to emit light. The control circuit comprises a first thin film transistor, a second thin film transistor, a third thin film transistor, and a storage capacitor, the first thin film transistor is the driving thin film transistor, and the first thin film transistor drives and controls a brightness of the first light-emitting element.

In one embodiment, the second thin film transistor is a switching thin film transistor, and the third thin film transistor is a detection thin film transistor.

In one embodiment, the display panel comprises a plurality of driving thin film transistor groups, one of the driving thin film transistor groups comprises at least two of the driving thin film transistors, and one of the driving thin film transistor groups is disposed corresponding to one of the first light-emitting element groups. When the driving thin film transistor controls the first light-emitting element to emit light, in the first direction, a current of the driving thin film transistor in the driving thin film transistor group close to the rotation axis is less than a current of the driving thin film transistor in another driving thin film transistor group far away from the rotation axis.

In one embodiment, the display panel comprises a substrate, and a material of the substrate comprises a transparent material.

In one embodiment, the material of the substrate comprises transparent glass or polyimide.

In one embodiment, the first light-emitting elements are arranged in m rows and n columns, and the display panel is refreshed once every rotation of a degree, then it satisfies:

a number N of first light-emitting elements in the t-th column:

$$N \geq \frac{360 \times m \times t}{a \times n};$$

and
wherein the first light-emitting elements are uniformly distributed on the column, and t is a positive integer greater than 1 and less than or equal to n.

In one embodiment, a distance between each of the first light-emitting element groups and the rotation axis is within a predetermined distance range, the first light-emitting element group includes at least two of the first light-emitting elements.

Beneficial Effects

In this disclosure, the display panel rotates around a rotation axis. The display panel comprises a plurality of first light-emitting element groups disposed in a first direction, and the first light-emitting element group comprises a plurality of first light-emitting elements. In the first direction, the distribution density of each of the first light-emitting elements in the first light-emitting element group close to the rotation axis is less than the distribution density of each of the other first light-emitting elements in the first light-emitting element group far from the rotation axis. The distribution density of the light-emitting element close to the rotation axis is adjusted to reduce. When the display device performs 3D display, the brightness of the light-emitting element close to the rotation axis within the predetermined range can be consistent with the brightness of the light-emitting element not within the predetermined range. In a 3D display device, the problem of uneven overall brightness of the display device caused by different rotational linear speeds of the light-emitting elements at different positions on the display panel is solved, and the display brightness uniformity of the 3D display device is further improved.

Reference number: display panel—10, first direction—F1, second direction—F2, rotation axis—20, predetermined distance range—S, first subgroup—1011, first display portion—10A1, second display portion—10A2, first light-emitting element group—101$a$1, second light-emitting element group—101$a$2, first light-emitting element—102$a$1, second light emitting element—102$a$2, driving thin-film transistor—T1, light-emitting layer—M10, array substrate—M20, substrate—M201, driver layer—M202, gate electrode—T102, source electrode—T104, drain electrode—T103, channel portion—T101, width—W, length—L.

DETAILED DESCRIPTION OF PREFERRED EMBODIMENTS

The disclosure provides a display device. The technical solutions in the embodiments of the disclosure will be described clearly and completely below with reference to the drawings in the embodiments of the disclosure. It should be understood that the specific embodiments described herein are only used to explain the disclosure, but not to limit the disclosure.

At present, there are many types of rotary display devices. One type of the rotary display devices is the "3D" fan screen. The "3D" fan screen uses LED lamp beads as light-emitting elements, which has the problem of low resolution and uneven display. Another type of the rotary display device is a scanning 3D display device, which uses one side of the display device as an axis to perform rotary scanning to form a cylindrical display space. This makes the display device displays higher brightness at a position close to s rotating axis, and the overall brightness of the display panel is unevenly displayed, which affects the actual display effect.

At present, the main methods to solve the above problems are to change the physical structure of the rotary display device or to adjust the pixel lighting process through algorithms. These methods are not universal and greatly increase the complexity of the display method.

In order to solve the above technical problems, the disclosure provides the following technical solutions, with specific reference to the following embodiments and the accompanying drawings FIG. 1 to FIG. 10.

Figure 1:
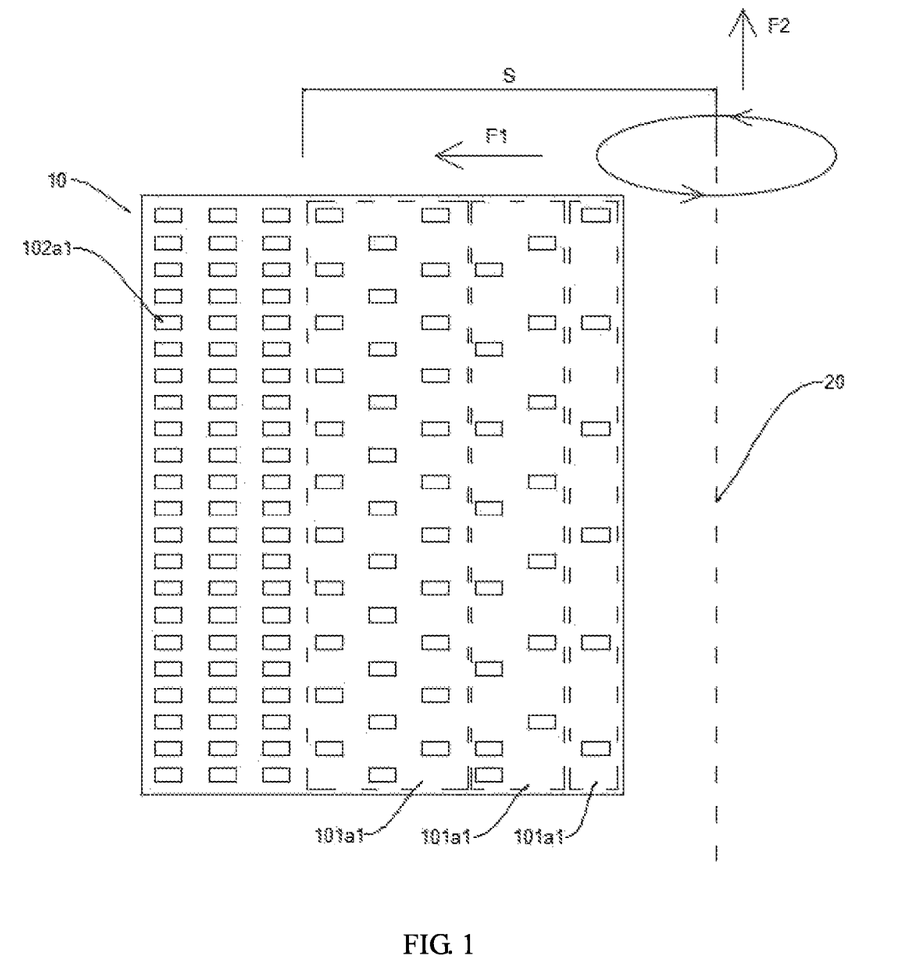
FIG. 1 is a schematic structural diagram of a display device according to an embodiment of the disclosure.
Figure 2:
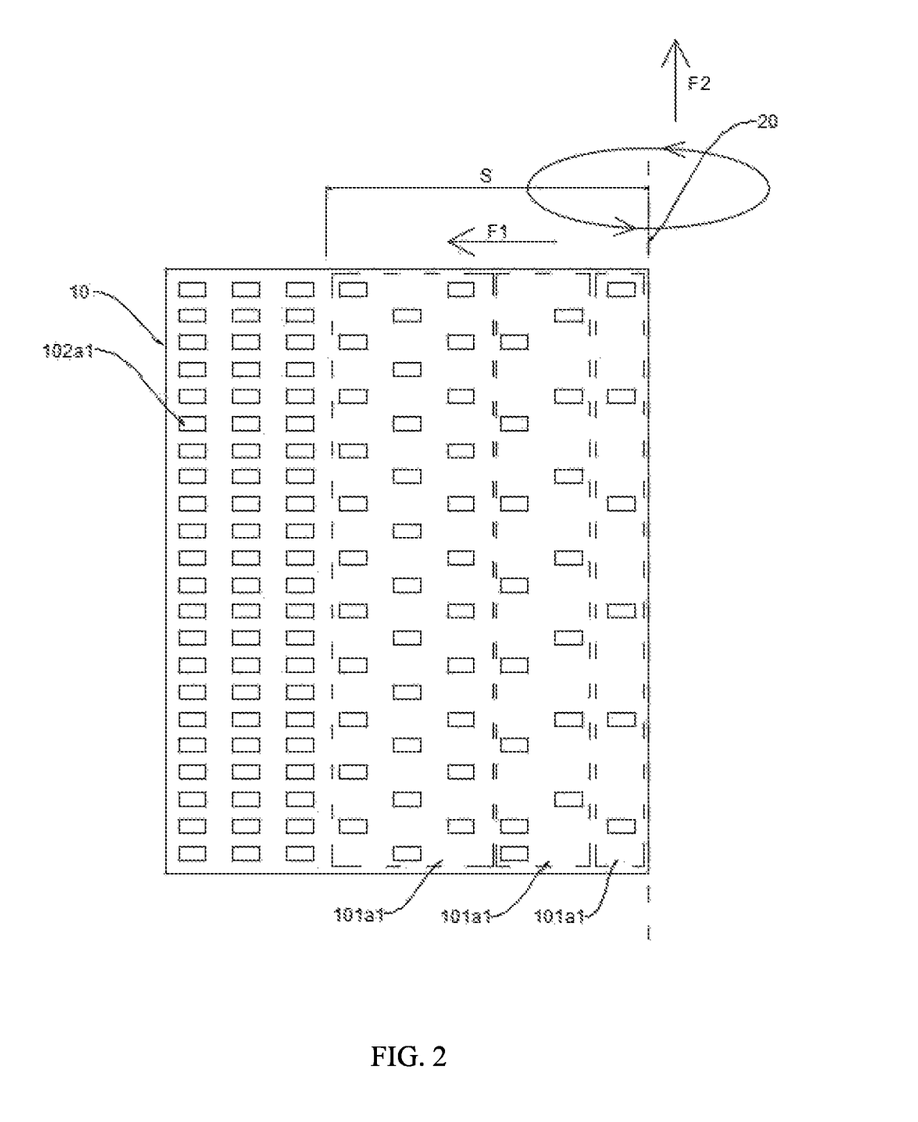
FIG. 2 is a schematic structural diagram of another display device according to an embodiment of the disclosure.
Figure 3:
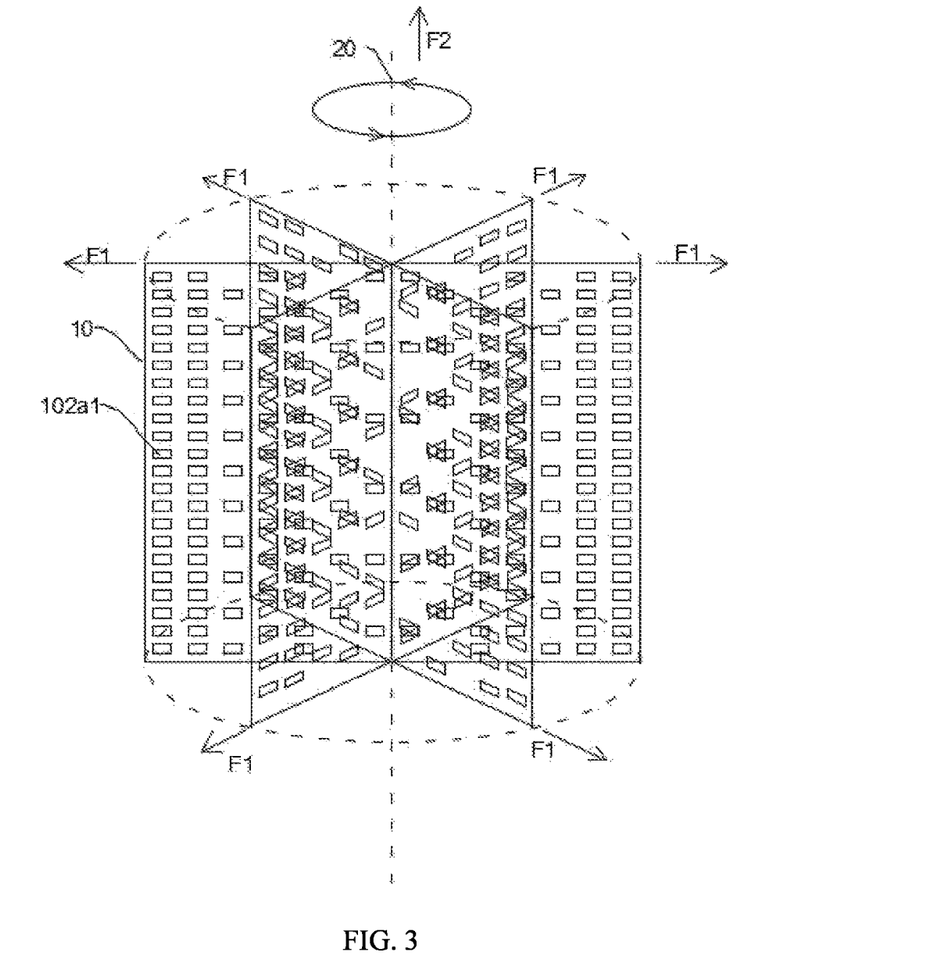
FIG. 3 is a schematic structural diagram of the display device in a use state according to an embodiment of the disclosure.

Referring to FIG. 1 to FIG. 3, The disclosure provides a display device.

The display device comprises at least one display panel 10. The display panel 10 is rotated around a rotation axis 20 to display. The display panel 10 comprises a plurality of light-emitting elements arranged at intervals. The plurality of light-emitting elements includes a plurality of first light-emitting elements 102a1, the first light-emitting element 102a1 comprises a plurality of first light-emitting element groups 101a1 arranged in a first direction F1. The first direction F1 is perpendicular to the rotation axis 20, and the first direction F1 extends from the rotation axis 20 to the side of the display panel 10 away from the rotation axis 20.

In the first direction F1, a distribution density of the first light-emitting element 102a1 in the first light-emitting element group 101a1 close to the rotation axis 20 is less than that in the first light-emitting element group 101a1 far from the rotation axis 20.

Specifically, a distance between each of the first light-emitting element groups 101a1 and the rotation axis 20 is within a predetermined distance range S. The first light-emitting element group 101a1 includes at least two first light-emitting elements 102a1.

Specifically, the display device is a three-dimensional stereoscopic display device, which realizes the display of three-dimensional images by disposing the display panel 10 to rotate around a rotation axis 20. The rotation axis 20 can be a virtual axis or a real axis, and the rotation mode of the display panel 10 can be autorotation or revolution.

Further, the rotation axis 20 can be disposed on the display panel 10 (as shown in FIG. 2 and FIG. 3, the rotation axis can be disposed on one side of the display panel 10 or on the display panel 10 to divide the display panel 10). The rotation axis can also be disposed outside the display panel 10 as shown in FIG. 1. In this embodiment, the display device shown in FIG. 2 is used as an example for description.

Specifically, the display panel 10 can be an organic electroluminescence display panel 10, or a Mini/Micro-LED display panel. The display panel 10 has faster response speed, can achieve higher refresh rate, and can further improve the color gamut and display brightness of the display device.

Specifically, referring to FIG. 3, when there are multiple display panels 10, the multiple display panels 10 rotate around the same rotation axis 20. The display panel 10 may be a double-sided display panel or a single-sided display panel, which may be adjusted according to actual production conditions or requirements. This disclosure takes the single-sided display panel 10 as an example for description.

Figure 4:
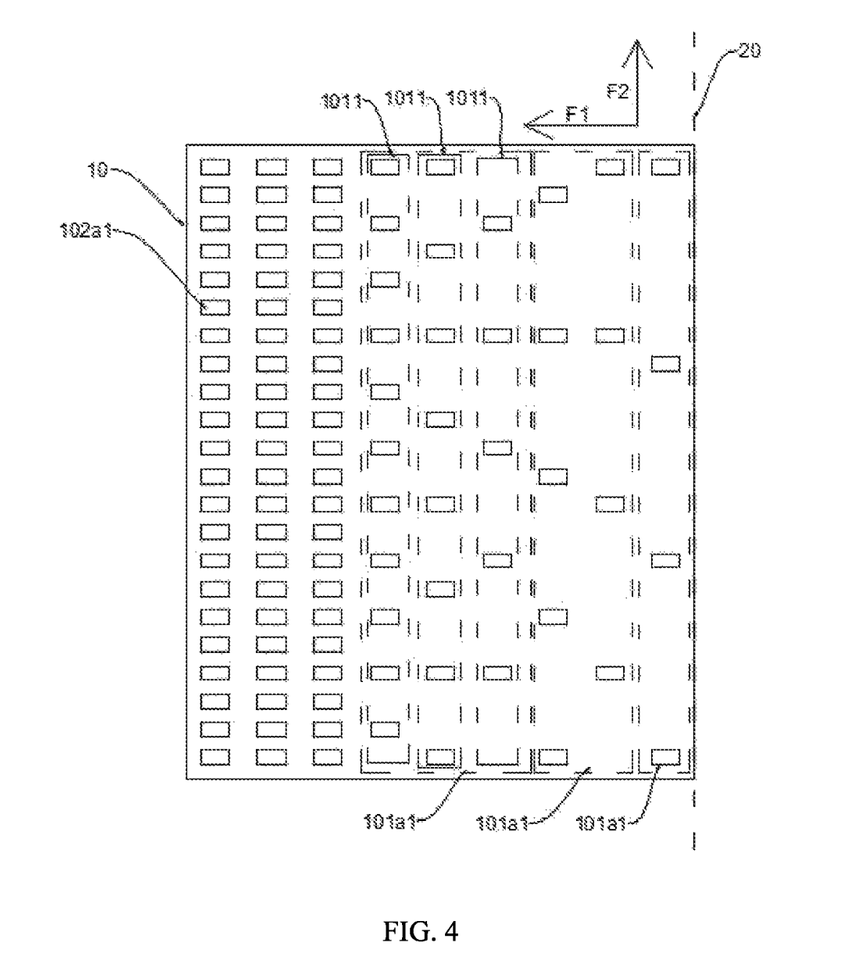
FIG. 4 is a schematic diagram of a display panel according to an embodiment of the disclosure.

Specifically, referring to FIG. 4, the display panel 10 includes a plurality of first light-emitting elements 102a1 arranged at intervals, and the plurality of first light-emitting elements 102a1 includes a plurality of first light-emitting element groups 101a1. A plurality of the first light emitting element groups 101a1 are arranged in sequence along the first direction F1, the first direction F1 is perpendicular to the rotation axis 20, and the first direction F1 extends from the rotation axis 20 to the side of the display panel 10 far from the rotation axis 20.

Besides, the predetermined distance range S is determined according to the actual production situation of the display panel 10, and specifically determined according to the PPI of the display panel 10. The distribution density of light-emitting elements can be adjusted within the predetermined distance range S.

Within the predetermined distance range S, the distribution density of the light-emitting elements is adjusted so that the brightness of different positions in the three-dimensional display process of the display panel 10 can be adjusted synchronously.

Outside the predetermined distance range S, the distribution density of the first light-emitting element 102a1 within the first light-emitting element group 101a1 reaches the maximum value of the pixel PPI, and the distribution density of the first light-emitting element 102a1 outside predetermined distance range S is equal everywhere.

Specifically, the distances between the plurality of first light-emitting element groups 101a1 can be the same or different, which is not specifically limited herein, but the difference in the distances between the plurality of first light-emitting element groups 101a1 has little effect on the uniformity of light emission of the display device Specifically, one of the first light-emitting element groups 101a1 includes at least two first light emitting elements 102a1, and the lengths of the plurality of first light-emitting element groups 101a1 in the second direction F2 (parallel to the rotation axis 20) are constant.

Specifically, when the first light-emitting element group 101a1 includes a plurality of first light emitting elements 102a1 arranged at intervals, the distribution density of the first light-emitting elements 102a1 in the first light-emitting element group 101a1 can also be gradually increased in the first direction F1, or a plurality of first light-emitting elements 102a1 in the first light-emitting element group 101a1 can be uniformly distributed.

Specifically, the distribution density refers to the number of the first light-emitting elements 102a1 in the same unit area, and the length of the unit area may be the same as the length of the side of the display panel 10 parallel to the rotation axis 20. The width of the panel is at least greater than the width of the first light-emitting element 102a1

Specifically, in one embodiment, the first light-emitting elements are arranged in m rows and n columns, and the display panel is refreshed once every rotation of α degree, then it satisfies:

a number N of first light-emitting elements in the t-th column:

$$N \geq \frac{360 \times m \times t}{a \times n}.$$

The first light-emitting elements are uniformly distributed on the column, and t is a positive integer greater than 1 and less than or equal to n.

The use of the first light-emitting element 102a1 of the display panel 10 can be in a state of maximum efficiency by adopting the above technical solution.

Specifically, in this embodiment, the display panel 10 includes a control circuit, and the control circuit controls at least one of the first light-emitting elements 102a1 to emit light and display (including switching and brightness adjustment of the first light-emitting element 102a1). The embodiments of the disclosure are described by taking a control circuit controlling a first light-emitting element 102a1 to emit light as an example, but the disclosure is not limited thereto. A control circuit can synchronously control two or more first light-emitting elements 102a1 to emit light, which can be adjusted according to actual production conditions.

The control circuit can include a first thin film transistor, a second thin film transistor, a third thin film transistor, and a storage capacitor Cst. The first thin film transistor is a driving thin film transistor T1, the second thin film transistor is a switching thin film transistor, the third thin film transistor is a detection thin film transistor, and the first thin film transistor controls the brightness of the first light emitting element 102a1.

It can be understood that in this embodiment of the disclosure, the display panel 10 is disposed to rotate around a rotation axis 20, the display panel 10 includes a plurality of first light-emitting elements 102a1 arranged at intervals, and the plurality of first light-emitting elements 102a1 includes a plurality of first light-emitting element groups 101a1, the distance between each first light-emitting element group 101a1 and the rotating axis 20 is within a predetermined distance range S, the first light-emitting element group 101a1 includes at least two first light-emitting elements 102a1, and a plurality of first light-emitting element groups 101a1 are arranged in sequence along the first direction F1. In the first direction F1, the distribution density of the first light-emitting element 102a1 in the first light-emitting element group 101a1 close to the rotation axis 20 is less than that in the first light-emitting element group 101a1 far away from the rotation axis 20. By reducing the distribution density of the first light-emitting element 102a1 close to the rotation axis 20, the brightness of the first light-emitting element 102a1 close to the rotation axis 20 within the predetermined distance range S can be consistent with the brightness of the first light-emitting element 102a1 not within the predetermined distance range S when the display device performs three-dimensional display. In a 3D display device, the problem of uneven overall brightness of the display device caused by different rotational linear speeds of the light-emitting elements 1021 at different positions on the display panel 10 is solved, and the display brightness uniformity of the 3D display device is further improved.

Figure 5:
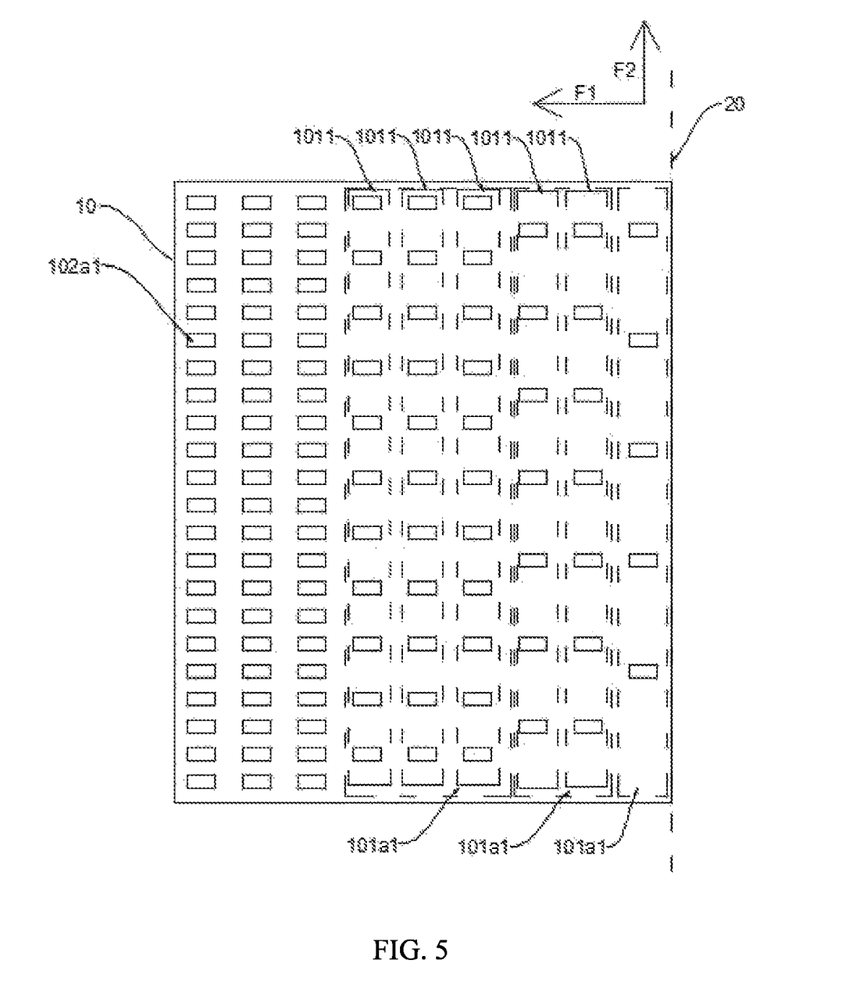
FIG. 5 is a schematic diagram of another display panel according to an embodiment of the disclosure.

In one embodiment, as shown in FIG. 5, the first light-emitting element group 101a1 includes at least one of the first subgroups 1011. The first subgroup 1011 includes at least two of the first light-emitting elements 102a1, and at least two of the first light-emitting elements 102a1 in the first subgroup 1011 are arranged in sequence along the second direction F2. The second direction F2 is parallel to the rotation axis 20, and the distribution density of the first light-emitting elements 102a1 in each of the first subgroups 1011 in at least one of the first light emitting element groups 101a1 is the same.

Specifically, the plurality of the first light-emitting element groups 101a1 include a plurality of first subgroups 1011, and a plurality of first subgroups 1011 can be sequentially arranged along the first direction F1, and the first light-emitting elements 102a1 in the first subgroup 1011 are sequentially arranged along the second direction F2.

Specifically, the distribution density of the first light-emitting elements 102a1 in each of the first subgroups 1011 in the first light-emitting element group 101a1 is the same. However, it is not limited that the distribution densities of the first subgroups 1011 in all the first light-emitting element groups 101a1 are the same (as shown in FIG. 4). The distribution density of the plurality of light-emitting elements of the plurality of light-emitting unit groups will increase. Meanwhile, as shown in FIG. 5, the distribution densities of the first light-emitting elements 102a1 in some positions can be equal, and the brightness adjustment flexibility of the display panel 10 is improved, and the brightness uniformity displayed by the display device is not affected.

Specifically, within the same first subgroup 1011, a plurality of first light-emitting elements 102a1 can be uniformly spaced or can include a plurality of distance distances, which can be adjusted according to the shape of the display panel 10 of the display device or the actual rotation of the rotation axis 20 to make the display brightness of the display device more uniform.

It can be understood that the distribution densities of the first light-emitting elements 102a1 in each of the first subgroups 1011 in at least one of the first light-emitting element groups 101a1 are different, so that the brightness adjustment flexibility of the display panel 10 of the display device is better, and does not affect the brightness uniformity displayed by the display device.

Based on the above-mentioned embodiment, The first light-emitting element group 101a1 includes at least two first subgroups 1011 arranged along the first direction F1. The first subgroup 1011 includes a plurality of the first light-emitting elements 102a1, and a plurality of the first light-emitting elements 102a1 are uniformly arranged along the second direction F2.

It should be noted that since the display panel 10 rotates around the rotation axis 20, the reason why the display panel 10 rotates correspondingly and produces bright lines is that the rotation line speeds of different first light-emitting elements 102a1 in the first direction F1 are different. However, in the second direction F2, the rotation line speeds of each first light-emitting element 102a1 are the same.

It can be understood that the first light-emitting elements 102a1 in the first subgroup 1011 are evenly spaced in the second direction F2, which can make the display brightness of the display panel 10 on the second direction F2 more uniform and improve the display brightness uniformity of the display device.

Figure 6:
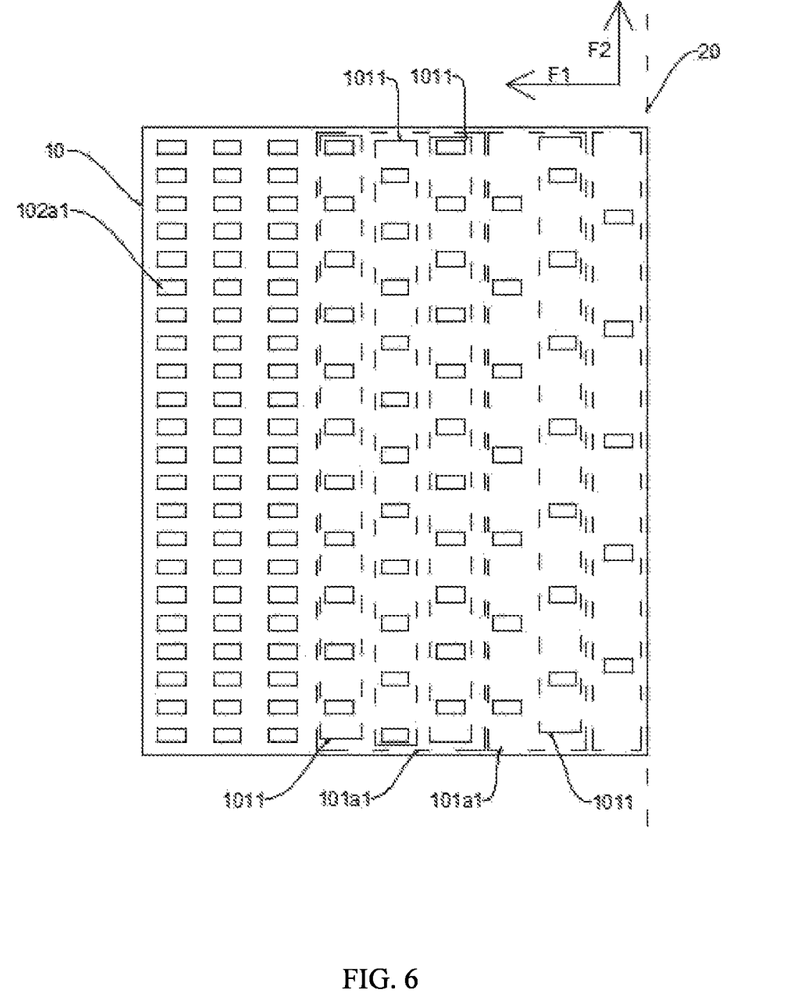
FIG. 6 is a schematic structural diagram of the display device in a use state according to an embodiment of the disclosure.

In one embodiment, as shown in FIG. 6, within any two adjacent first subgroups 1011, the first light-emitting elements 102a1 in the first subgroup 1011 and the first light-emitting elements 102a1 in the other first subgroup 1011 are arranged alternately along the second direction F2.

Specifically, in this embodiment, the term arranged alternately refers to that, in the first direction F1, the two adjacent first subgroups 1011 are respectively the first subgroup 1011 and the second first subgroup 1011, and the first light-emitting elements 102a1 in the first subgroup 1011 and the first light-emitting elements 102a1 in the second subgroup 1011 are arranged in different rows.

It can be understood that in any two adjacent first subgroups 1011, the first light emitting element 102a1 in one first subgroup 1011 and the first light emitting element 102a1 in the other first subgroup 1011 are arranged alternately along the second direction F2. This can effectively prevent the problem that horizontal bright lines are generated in some positions because the first light-emitting elements 102a1 are too dense during the display process of the display device, thereby further improving the display uniformity of the display device.

In an embodiment, the first light emitting element group 101a1 includes at least two first subgroups 1011 arranged along the first direction F1. In any two of the first light-emitting element groups 101a1, the distance between the first subgroups 1011 in one of the first light-emitting element groups 101a1 is equal to the distance between the first subgroups 1011 in the other first light-emitting element group 101a1.

Specifically, the distance between the first subgroups 1011 in the first light emitting element group 101a1 is equal to that between the first subgroups 1011 in the other first light emitting element group 101a1. It can be understood that in the first direction F1, in any one of the first light emitting element groups 101a1, the arrangement of the first subgroups 1011 is uniform.

It can be understood that the distance between the first subgroups 1011 in the first light emitting element group 101a1 is equal to the distance between the first sub groups 1011 in the other first light emitting element group 101a1, which can make the brightness of the display panel 10 in the first direction F1 more uniform, and facilitate the production of the display panel 10.

Figure 7:
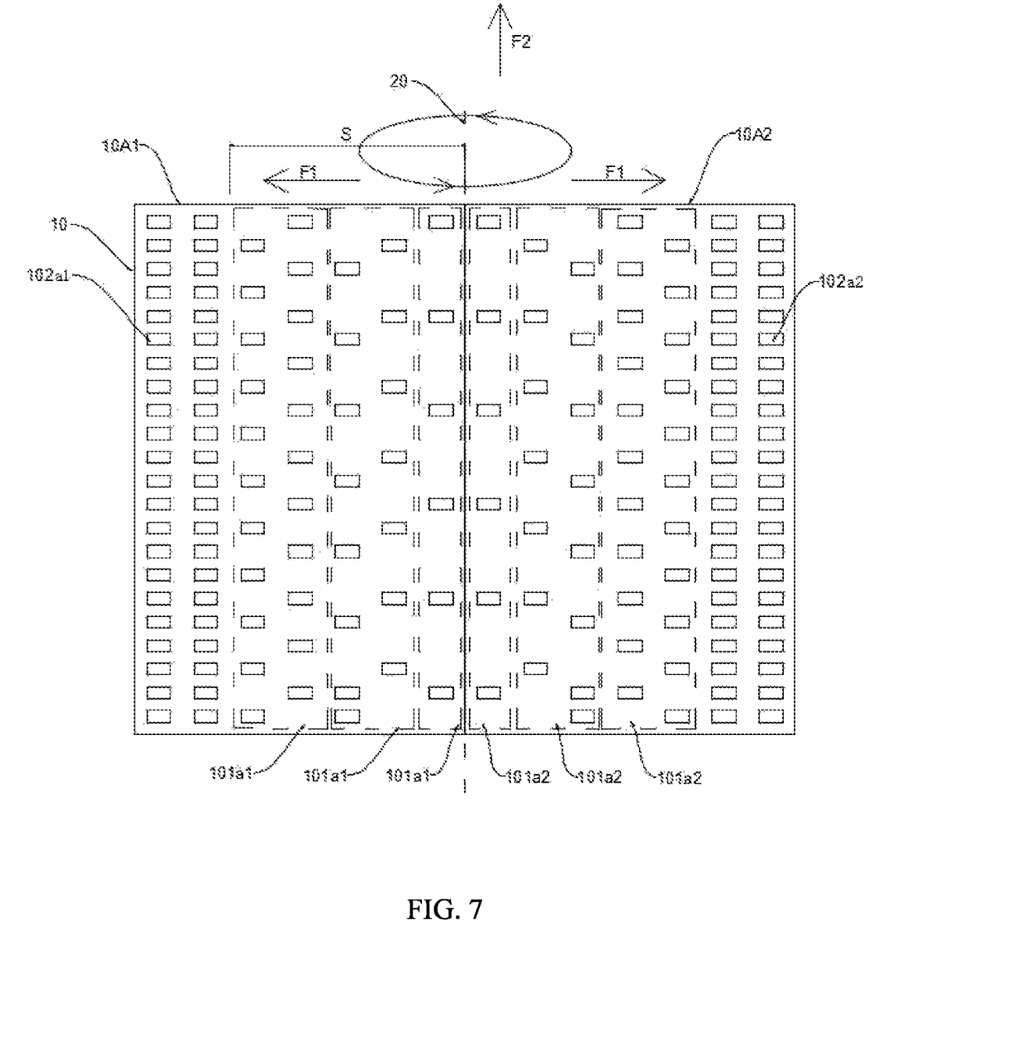
FIG. 7 is a schematic diagram of the configuration of a light-emitting element disposed on the display device according to an embodiment of the disclosure.
Figure 8:
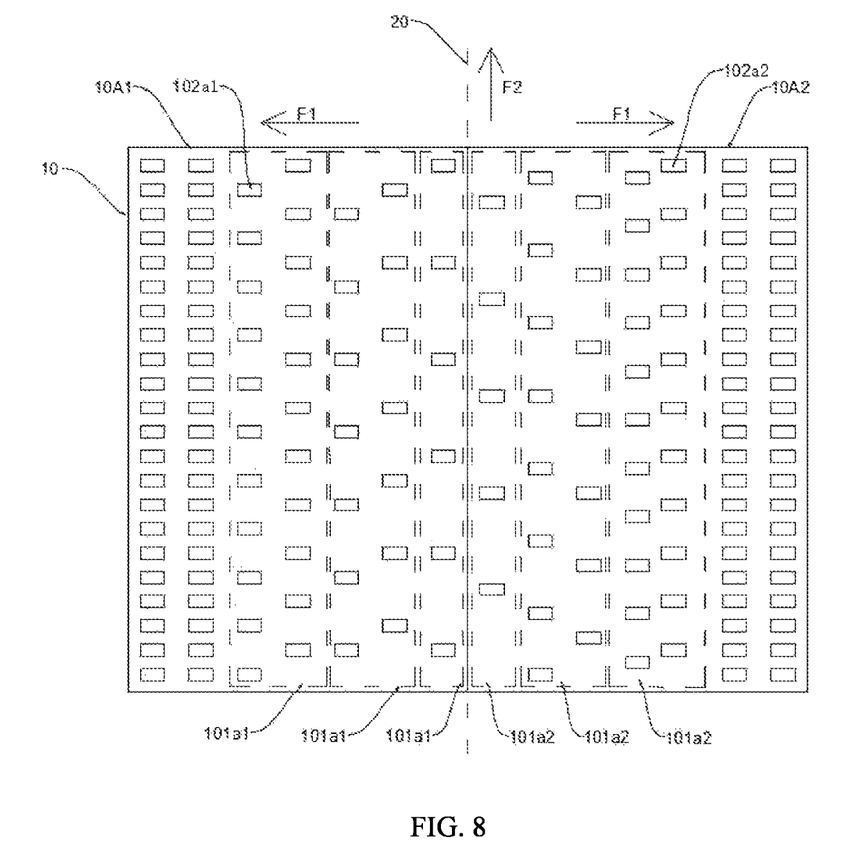
FIG. 8 is a schematic diagram of the configuration of a light-emitting element disposed on the display device according to another embodiment of the disclosure.

In one embodiment, as shown in FIG. 7 and FIG. 8, the rotation axis 20 divides the display panel 10 into a first display portion 10A1 and a second display portion 10A2, and a plurality of the first light emitting elements 102a1 are disposed in the first display section 10A1. The second display portion 10A2 comprises a plurality of second light emitting element groups 101a2 arranged along the first direction F1, and the second light emitting element group 101a2 comprises a plurality of second light emitting elements 102a2.

As shown iv FIG. 8, in the first light emitting element group 101a1 and the second light emitting element group 101a2 with the same length from the rotation axis 20, the rotation paths of a plurality of first light emitting elements 102a1 of the first light emitting element group 101a1 and the rotation paths of a plurality of second light emitting elements 102a2 of the second light emitting element group 101a2 do not overlap.

It should be noted that when there are two or more display panels 10 (or two or more display portions) on the rotation axis 20 rotating around the rotation axis 20, the present embodiment takes two display portions as an example for description. When some of the light-emitting elements of the two display portions are symmetrical with respect to the rotation axis 20 and the display device displays, the corresponding symmetrical portions cause the brightness of the corresponding positions to overlap, resulting in bright spots or bright lines, which affect the display effect of the three-dimensional display. In order to avoid the above technical problems, the technical solutions of this embodiment are provided.

Specifically, in this embodiment, the display panel 10 can be a whole display panel 10 or can be a spliced display panel 10. If the display panel is a spliced display panel 10, the splicing seam coincides with the rotation axis 20.

Specifically, in this embodiment, the areas of the first display portion 10A1 and the second display portion 10A2 can be the same or different. In this embodiment, the areas of the first display part 10A1 and the second display part 10A2 are the same as an example.

Specifically, since the first display portion 10A1 and the second display portion 10A2 are symmetrically arranged (symmetrical in shape), the first light emitting element 102a1 of the first display portion 10A1 and the second light emitting element 102a2 of the second display portion 10A2 are arranged asymmetrically.

Specifically, the change rate of the first light emitting element 102a1 of the first display portion 10A1 (the change rate of the distribution density of the plurality of first light emitting elements 102a1 with respect to the distance from the rotation axis 20) is the same as that of the second light emitting element 102a2 of the second display portion 10A2.

Specifically, in the first direction F1, the first light emitting element group 101a1 and the second light emitting element group 101a2 comprise the same length from the rotation axis 20, the first light emitting elements 102a1 in the first light emitting element group 101a1 and the second light emitting elements 102a2 in the second light emitting element group 101a2 are arranged in different rows.

In other words, in this embodiment, the first display portion 10A1 at least partially overlaps with the second display portion 10A2 after being rotated around the rotation axis 20. However, the first light emitting element 102a1 of the first display portion 10A1 does not overlap with the second light emitting element 102a2 of the second display portion 10A2.

Specifically, when the three display panels 10 are rotated around the rotation axis 20 and the three display panels 10 are axially symmetrical with respect to the rotation axis 20, after the three display panels 10 are rotated and overlapped around the rotation axis 20, the light-emitting elements of the three display panels 10 are not overlapped.

It can be understood that by adopting the above technical solution, the display effect of the display device can be made more uniform, and the arrangement of multiple display panels 10 will not produce bright lines or bright spots when the display device performs three-dimensional display, thus improving the display effect of the display device and prolonging the service life of the display device.

Based on the above embodiment, the distance from the side of the first display portion 10A1 away from the rotation axis 20 to the rotation axis 20 is equal to the distance from the side of the second display portion 10A2 away from the rotation axis 20 to the rotation axis 20.

Specifically, in this embodiment, the area of the first display portion 10A1 and the area of the second display portion 10A2 are equal, and the shape of the first display portion 10A1 is the same as the shape of the second display portion 10A2. The rate of change of the first light-emitting elements 102a1 of the first display portion 10A1 (the rate of change of the distribution density of the plurality of first light-emitting elements 102a1 relative to the distance from the rotation axis 20) is the same as that of the second light emitting element 102a2 of the second display portion 10A2. The difference on the first display portion 10A1 is that the arrangement position of the first light emitting element 102a1 of the first display portion 10A1 is different from that of the light emitting element on the second display portion 10A2.

In one embodiment, the display panel 10 includes a plurality of driving thin film transistors T1, one of the driving thin film transistors T1 is connected to one of the first light emitting elements 102a1.

When the first light emitting element 102a1 emits light, the current in the driving thin film transistor T1 connected to the first light emitting element 102a1 close to the rotation axis is less than the current in the driving thin film transistor T1 connected to the first light emitting element 102a1 far from the rotation axis 20.

Figure 9:
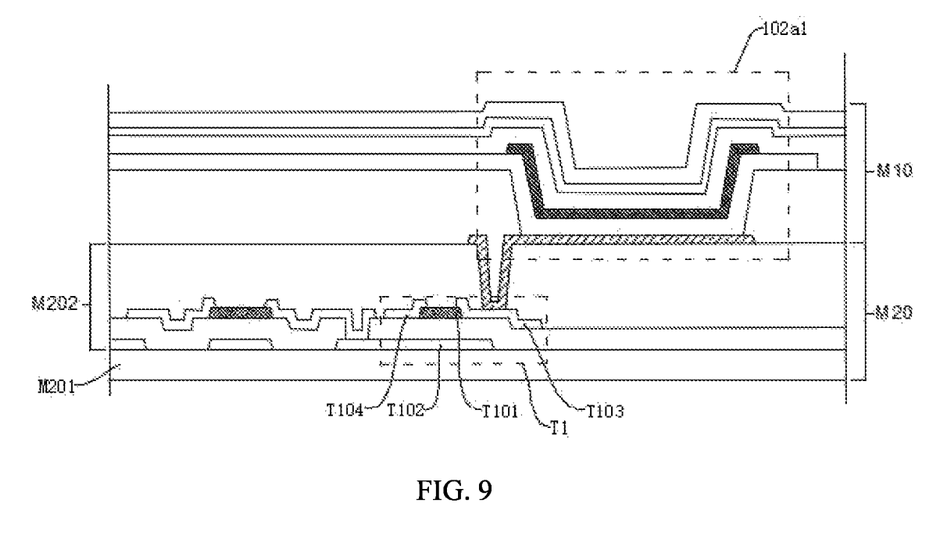
FIG. 9 is a schematic structural diagram of a display panel according to an embodiment of the disclosure.

Referring to FIG. 9, the display panel 10 includes a plurality of driving thin film transistors T1, the plurality of driving thin film transistors T1 includes a plurality of driving thin film transistor groups, and one of the driving thin film transistor groups includes at least two of the driving thin film transistors T1. The driving thin film transistor group is disposed corresponding to the first light emitting element group 101a1, and the driving thin film transistor T1 is connected to the first light emitting element 102a1.

When the driving thin film transistor T1 controls the first light-emitting element 102a1 to emit light, in the first direction F1, the current of the driving thin film transistor T1 in one driving thin film transistor group close to the rotation axis 20 is less than the current of the driving thin film transistor T1 in the driving thin film transistor group in another driving thin film transistor group far away from the rotation axis 20.

It should be noted that when the distance between the first light-emitting elements 102a1 close to the rotation axis 20 is too large, it may cause uneven brightness distribution, or the PPI displayed by the display device may be affected, and the display effect may be affected. In order to avoid the above technical problems, the technical solution of this embodiment is provided.

Specifically, the display panel 10 includes a control circuit, the control circuit includes a driving thin film transistor T1, and the driving thin film transistor T1 controls the brightness of the first light emitting element 102a1. Moreover, when the display panel 10 displays, the greater the current passing through the driving thin film transistor T1, the greater the brightness of the first light-emitting element 102a1. That is, the brightness of the first light emitting element 102a1 is positively related to the current flowing through the driving thin film transistor T1.

Specifically, the control method for the current flowing through the driving thin film transistor T1 includes but is not limited to preset the driving chip of the display panel 10, or controlling the current flowing through the driving thin film transistor T1 in different rows and columns by connecting resistors of different resistance values in series in the control circuit.

It can be understood that the driving thin film transistor group is disposed corresponding to the first light-emitting element group 101a1. The driving thin film transistor T1 is connected to the first light emitting element 102a1. When the driving thin film transistor T1 controls the first light-emitting element 102a1 to emit light, in the first direction F1, the current of the driving thin film transistor T1 in the driving thin film transistor group close to the rotation axis 20 is less than the current of the driving thin film transistor T1 in the driving thin film transistor group in another driving thin film transistor group far away from the rotation axis 20. In the above-mentioned embodiment, in order to arrange the first light-emitting elements 102a1 to have different distribution densities, the distance between the first light-emitting elements 102a1 close to the rotation axis 20 is too large, the brightness distribution is uneven, the PPI that affects the display device is affected and display effect is affected. The technical solution can solve the above problems.

Figure 10:
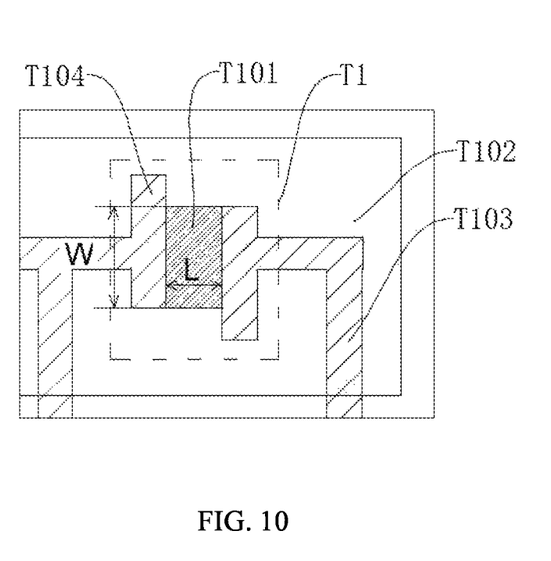
FIG. 10 is a top view of the structure of a channel portion of a driving thin film transistor according to an embodiment of the disclosure.

In one embodiment, as shown in FIG. 9 and FIG. 10, the display panel 10 includes an array substrate M20, the array substrate M20 includes an active layer, and the driving thin film transistor T1 includes a channel portion T101 disposed on the active layer.

In the first direction F1, a width to length ratio of a channel portion T101 of the driving thin film transistor T1 connected to the first light-emitting element close to the rotation axis 20 is less than a width to length ratio of a channel portion T101 of the driving thin film transistor T1 connected to the first light-emitting element away from the rotation axis 20.

Specifically, as shown in FIG. 9, the display panel 10 comprises an array substrate M20 and a light emitting layer M10 arranged on the array substrate. The light emitting layer M10 comprises a plurality of first light emitting elements 102a1. The driving thin film transistor T1 disposed on the array substrate M20 is connected to its corresponding first light emitting element 102a1.

Specifically, the display panel 10 includes a control circuit, and the control circuit includes a first thin film transistor, a second thin film transistor, a third thin film transistor, and a storage capacitor. The first thin film transistor is a driving thin film transistor T1, the second thin film transistor is a switching thin film transistor, the third thin film transistor is a detection thin film transistor, and the first thin film transistor controls the brightness of the first light emitting element 102a1.

Specifically, the width of the channel portion T101 is shown as W in FIG. 10, which is the relative length between the source electrode T104 and drain electrode T103. The length of channel portion T101 is shown as L in FIG. 10, which is the distance between source T104 and drain T103.

Specifically, the voltage connected to each driving thin film transistor T1 is the same.

Specifically, as shown in FIG. 9, the driving thin film transistor T1 at least includes a gate electrode T102, a source electrode T104, a drain electrode T103, and an active layer. The active layer includes a channel portion T101 distributed between the source electrode T104 and the drain electrode T103. The width to length ratio of the channel portion T101 is reduced, and the on-state current of the corresponding driving thin film transistor T1 is reduced.

Specifically, the driving thin film transistor T1 is a low temperature polysilicon thin film transistor, an oxide semiconductor thin film transistor, or an amorphous silicon thin film transistor.

The gate electrode of the second thin film transistor is electrically connected to the scanning voltage signal line, the source electrode is electrically connected to the data voltage signal line, and the drain electrode is electrically connected to the gate T102 of the first thin film transistor and one end of the storage capacitor. The source electrode T104 of the first thin film transistor is electrically connected to the positive voltage of the power supply, and the drain electrode T103 is electrically connected to the anode of the light-emitting element. The cathode of the first light-emitting element 102a1 is electrically connected to the negative voltage of the power supply, one end of the storage capacitor Cst is electrically connected to the drain electrode of the second thin film transistor and the gate electrode T102 of the first thin film transistor, and the other end of the storage capacitor Cst is electrically connected to the drain electrode T103 of the first thin film transistor, the anode of the first light emitting element 102a1 and the source electrode of the third thin film transistor. The gate electrode of the third thin film transistor is electrically connected to the data signal, the source electrode is electrically connected to the drain electrode T103 of the first thin film transistor, the drain electrode of the third thin film transistor is connected to the detection voltage, and the drain electrode of the third thin film transistor is connected to the detection voltage (VCM) and the detection voltage is a constant voltage.

The control circuit controls the reset period of the first light-emitting element 102a1, and the scan voltage and data of the control circuit are respectively applied to the gate electrode and source electrode T104 of the second thin film transistor in the control circuit. During the data writing period of each control circuit, the third switching thin film transistor in the control circuit is turned on to apply the data voltage to the drain electrode T103 of the first thin film transistor. During the light-emitting period during which the control circuit controls the first light-emitting element 102a1, the first thin film transistor is turned on, so that the first light-emitting element 102a1 connected to the drain T103 of the first thin film transistor emits light.

In one embodiment, the array substrate M20 includes a substrate M201 and a driving element layer M202 disposed on the substrate M201, and the substrate M201 is made of a transparent material.

Specifically, the material of the substrate M201 can be transparent glass, polyimide, or the like.

Specifically, the driving element layer M202 includes a plurality of driving thin film transistors T1. The driver layer M202 includes multilayer insulating layers arranged in layers, and active layers, grid layers, and source drain layers arranged between the insulating layers. The active layer comprises a channel portion T101, a source connection part and a drain connection part arranged on both sides of the channel portion T101. The source connection part is connected to the source electrode T104, and the drain connection part is connected to the drain electrode T103. The gate electrode T102 on the gate layer is disposed above or below the channel portion T101 (lower in FIG. 10), and its projection in the direction perpendicular to the array substrate M20 covers the channel portion T101.

It can be understood that the material of the substrate M201 of the driving element layer M202 is a transparent material, so that the display device has higher transparency and the picture displayed by the three-dimensional display device is more realistic, and the user experience is improved.

In summary, the display panel 10 is disposed to rotate around a rotation axis 20, the display panel 10 includes a plurality of first light-emitting elements 102a1 arranged at intervals. The distance between each first light-emitting element group 101a1 and the rotating axis 20 is within a predetermined distance range S. The first light-emitting element group 101a1 includes at least two first light-emitting elements 102a1, and a plurality of first light-emitting element groups 101a1 are arranged in sequence along the first direction F1. In the first direction F1, the distribution density of the first light-emitting element 102a1 in the first light-emitting element group 101a1 close to the rotation axis 20 is less than that in the first light-emitting element group 101a1 far away from the rotation axis 20. By reducing the distribution density of the first light-emitting element 102a1 close to the rotation axis 20, the brightness of the first light-emitting element 102a1 close to the rotation axis 20 within the predetermined distance range S can be consistent with the brightness of the first light-emitting element 102a1 not within the predetermined distance range S when the display device performs three-dimensional display. In a 3D display device, the problem of uneven overall brightness of the display device caused by different rotational linear speeds of the light-emitting elements 1021 at different positions on the display panel 10 is solved, and the display brightness uniformity of the 3D display device is further improved.

It can be understood that, for those of ordinary skill in the art, equivalent replacements or changes can be made according to the technical solutions and the inventive concept of the disclosure, and all these changes or replacements should belong to the protection scope of the appended claims of the disclosure.

What is claimed is:

1. A display device, comprising:
   at least one display panel, wherein the display panel is rotated around a rotation axis for display, and wherein the display panel comprises a plurality of first light-emitting element groups disposed in a first direction, the first light-emitting element group comprises a plurality of first light-emitting elements, the first direction is perpendicular to the rotation axis, and the first direction is directed from the rotation axis to a side of the display panel away from the rotation axis; and
   wherein a distribution density of each of the first light-emitting elements in the first light-emitting element group close to the rotation axis is less than the distribution density of each of the other first light-emitting elements in the first light-emitting element group far from the rotation axis;
   wherein the first light-emitting element group comprises a plurality of first subgroups disposed along the first direction, each of the first subgroups comprises a plurality of first light-emitting elements disposed along a second direction, and the second direction is parallel to the rotation axis; and
   wherein the distribution density of the first light-emitting elements in the plurality of first subgroups in at least one of the first light-emitting element groups is the same;
   wherein in any two adjacent first subgroups, the first light-emitting elements in one first subgroup and the first light-emitting elements in the other first subgroup are interlaced among each other along the second direction.

2. The display device according to claim 1, wherein the plurality of first light-emitting elements disposed in same first subgroup is evenly spaced along the second direction.

3. The display device according to claim 1, wherein one of the first light-emitting element groups comprises at least two first subgroups disposed along the first direction, and in any two of the first light-emitting element groups, a distance between each of the first subgroups in one of the first light-emitting element groups is equal to a distance between each of the first subgroups in the other first light-emitting element group.

4. The display device according to claim 1, wherein the display panel comprises a first display portion and a second display portion respectively disposed on opposite sides of the rotation axis, the plurality of the first light-emitting element groups is arranged in the first display portion, the second display portion comprises a plurality of second light-emitting element groups arranged along the first direction, the second light-emitting element group comprises a plurality of second light-emitting elements; and
   wherein in the first light-emitting element group and the second light-emitting element group with same length from the rotation axis, rotation paths of the plurality of first light-emitting elements of the first light-emitting element group and the plurality of second light-emitting elements of the second light-emitting element group do not overlap.

5. The display device according to claim 4, wherein a distance from one side of the first display portion away from the rotation axis to the rotation axis is equal to a distance from one side of the second display portion away from the rotation axis to the rotation axis.

6. The display device according to claim 5, wherein a change rate of the distribution density of the first light-emitting element of the first display portion and a change rate of a distribution density of the second light-emitting element of the second display portion are symmetrical with respect to the rotation axis.

7. The display device according to claim 4, wherein a shape of the first display portion and a shape of the second display portion are symmetrical with respect to the rotational axis.

8. The display device according to claim 1, wherein the display panel comprises a substrate, and a material of the substrate comprises a transparent material.

9. The display device according to claim 8, wherein the material of the substrate comprises transparent glass or polyimide.

10. A display device, comprising:
   at least one display panel, wherein the display panel is rotated around a rotation axis for display, and wherein the display panel comprises a plurality of first light-emitting element groups disposed in a first direction, the first light-emitting element group comprises a plurality of first light-emitting elements, the first direction is perpendicular to the rotation axis, and the first direction is directed from the rotation axis to a side of the display panel away from the rotation axis; and
   wherein a distribution density of each of the first light-emitting elements in the first light-emitting element group close to the rotation axis is less than the distribution density of each of the other first light-emitting elements in the first light-emitting element group far from the rotation axis;
   wherein the display panel comprises a plurality of driving thin film transistors, and one of the driving thin film transistors is connected to one of the first light-emitting elements; and
   wherein when the first light-emitting element emits light, a current in the driving thin film transistor connected to the first light-emitting element close to the rotation axis is less than a current in the driving thin film transistor connected to the first light-emitting element far from the rotation axis.

11. The display device according to claim 10, wherein in the first direction, a width to length ratio of a channel portion of the driving thin film transistor connected to the first light-emitting element close to the rotation axis is less than a width to length ratio of a channel portion of the driving thin film transistor connected to the first light-emitting element away from the rotation axis.

12. The display device according to claim 10, wherein the driving thin film transistor at least comprises a gate electrode, a source electrode, a drain electrode, and an active layer, and the active layer comprises the channel portion arranged between the source electrode and the drain electrode.

13. The display device according to claim 10, wherein the driving thin film transistor is a low-temperature polysilicon thin film transistor, an oxide semiconductor thin film transistor or an amorphous silicon thin film transistor.

14. The display device according to claim 10, wherein the display panel comprises a control circuit, the control circuit controls at least one of the first light-emitting elements to emit light; and
   wherein the control circuit comprises a first thin film transistor, a second thin film transistor, a third thin film transistor, and a storage capacitor, the first thin film transistor is the driving thin film transistor, and the first thin film transistor drives and controls a brightness of the first light-emitting element.

15. The display device according to claim 14, wherein the second thin film transistor is a switching thin film transistor, and the third thin film transistor is a detection thin film transistor.

16. The display device according to claim 10, wherein the display panel comprises a plurality of driving thin film transistor groups, one of the driving thin film transistor groups comprises at least two of the driving thin film transistors, and one of the driving thin film transistor groups is disposed corresponding to one of the first light-emitting element groups; and
   wherein when the driving thin film transistor controls the first light-emitting element to emit light, in the first direction, a current of the driving thin film transistor in the driving thin film transistor group close to the rotation axis is less than a current of the driving thin film transistor in another driving thin film transistor group far away from the rotation axis.

17. The display device according to claim 10, wherein the first light-emitting elements are arranged in m rows and n columns, and the display panel is refreshed once every rotation of a degree, then it satisfies:
   a number N of first light-emitting elements in the t-th column:

$$N \geq \frac{360 \times m \times t}{a \times n};$$

and
   wherein the first light-emitting elements are uniformly distributed on the column, and t is a positive integer greater than 1 and less than or equal to n.

18. A display device, comprising:
   at least one display panel, wherein the display panel is rotated around a rotation axis for display, and wherein the display panel comprises a plurality of first light-emitting element groups disposed in a first direction, the first light-emitting element group comprises a plurality of first light-emitting elements, the first direction is perpendicular to the rotation axis, and the first direction is directed from the rotation axis to a side of the display panel away from the rotation axis; and
   wherein a distribution density of each of the first light-emitting elements in the first light-emitting element group close to the rotation axis is less than the distribution density of each of the other first light-emitting elements in the first light-emitting element group far from the rotation axis;
   wherein a distance between each of the first light-emitting element groups and the rotation axis is within a predetermined distance range, when not within the predetermined distance range, the distribution density of the first light-emitting element is equal everywhere.

* * * * *